(12) United States Patent
Miyamoto

(10) Patent No.: US 8,842,229 B2
(45) Date of Patent: Sep. 23, 2014

(54) THIN FILM TRANSISTOR SUBSTRATE, METHOD FOR PRODUCING SAME, AND DISPLAY DEVICE

(75) Inventor: Tadayoshi Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 127 days.

(21) Appl. No.: 13/640,381

(22) PCT Filed: Jan. 12, 2011

(86) PCT No.: PCT/JP2011/000103
§ 371 (c)(1),
(2), (4) Date: Oct. 10, 2012

(87) PCT Pub. No.: WO2011/129037
PCT Pub. Date: Oct. 20, 2011

(65) Prior Publication Data
US 2013/0033655 A1 Feb. 7, 2013

(30) Foreign Application Priority Data

Apr. 16, 2010 (JP) ................. 2010-095013

(51) Int. Cl.
G02F 1/136 (2006.01)
H01L 27/12 (2006.01)
(52) U.S. Cl.
CPC ........ H01L 27/1214 (2013.01); H01L 27/1225 (2013.01)
USPC .............................. 349/43; 349/48

(58) Field of Classification Search
USPC ...................................... 349/43, 48
See application file for complete search history.

(56) References Cited

U.S. PATENT DOCUMENTS 6,839,108 B1  1/2005  Hirakata et al.
2009/0261325 A1  10/2009  Kawamura et al.
2010/0085081 A1  4/2010  Ofuji et al.

FOREIGN PATENT DOCUMENTS

JP  8-340116 A  12/1996
JP  11-337974 A  12/1999
JP  2001-250949 A  9/2001
JP  2009-4733 A  1/2009
JP  2009-260002 A  11/2009

Primary Examiner — Phu Vu
(74) Attorney, Agent, or Firm — Chen Yoshimura LLP

(57) ABSTRACT

Disclosed is an active matrix substrate (20a) that includes: an insulating substrate (10a); a first thin film transistor (5a) that is formed on the insulating substrate (10a) and that includes a first oxide semiconductor layer (13a) having a first channel region (Ca); a second thin film transistor (5b) that is formed on the insulating substrate (10a) and that includes a second oxide semiconductor layer (13b) having a second channel region (Cb); and an interlayer insulating film (17) that covers the first oxide semiconductor layer (13a) and the second oxide semiconductor layer (13b). A channel protective film (25), which is formed of a material different from that of the interlayer insulating film (17), is provided between the second oxide semiconductor layer (13b) and the interlayer insulating film (17) on the second channel region (Cb) in the second oxide semiconductor layer (13b).

20 Claims, 15 Drawing Sheets (a)

(b)

(c)

THIN FILM TRANSISTOR SUBSTRATE, METHOD FOR PRODUCING SAME, AND DISPLAY DEVICE

TECHNICAL FIELD

The present invention relates to a thin-film transistor substrate, and more particularly, to a thin-film transistor substrate that uses a semiconductor layer made of an oxide semiconductor, a method of manufacturing same, and a display device.

BACKGROUND ART

In an active matrix substrate, thin-film transistors (hereinafter also referred to as "TFTs"), for example, are provided as switching elements in respective pixels, each of which is the smallest unit of an image.

A typical bottom-gate TFT is provided with a gate electrode disposed on an insulating substrate, a gate insulating film disposed so as to cover the gate electrode, a semiconductor layer disposed on the gate insulating film in an island shape so as to overlap the gate electrode, and a source electrode and a drain electrode disposed on the semiconductor layer so as to face each other, for example.

In a typical display device in which peripheral circuits are integrated, thin-film transistors that are used for the switching elements of pixels are required to have a low leak current, and thin-film transistors that are used for the peripheral circuits are required to have a low threshold voltage and capability of high-speed drive, for example.

In fabricating a peripheral circuit that uses a plurality of thin-film transistors, in view of high-speed drive, a CMOS inverter or an enhancement/depletion (E/D) inverter is widely used. The CMOS inverter requires both an n-channel type and a p-channel type. The enhancement/depletion (E/D) inverter is constituted of two thin-film transistors, which have a large difference in respective threshold voltages.

In an active matrix substrate in recent years, for a switching element in each pixel, which is the smallest unit of an image, a TFT using a semiconductor layer made of an oxide semiconductor (hereinafter also referred to as "oxide semiconductor layer") has been proposed to replace a conventional thin-film transistor that uses an amorphous silicon semiconductor layer. This oxide semiconductor layer is formed of an IGZO (In—Ga—Zn—O) semiconductor film that has a high-speed mobility.

Many oxide semiconductors with high-speed mobility such as amorphous IGZO show n-type (electron) conduction, and are not changed to p-type (hole) conduction even by doping, and thus, a CMOS circuit structure cannot be employed. Therefore, a circuit that uses the oxide semiconductor with high-speed mobility has a problem that a CMOS inverter circuit cannot be used, and in order to achieve such a circuit, it is necessary to fabricate an E/D inverter circuit that can independently control threshold voltages of the respective thin-film transistors and that is capable of high-speed operation.

An E/D inverter that is constituted of thin-film transistors each having an oxide semiconductor as a channel layer has been disclosed. More specifically, disclosed is an E/D inverter in which a channel layer of a first thin-film transistor and a channel layer of a second thin-film transistor have mutually different thicknesses, and at least one of the respective channel layers of the first thin-film transistor and of the second thin-film transistor has been heat-treated. It is described that, in such a configuration, by a difference in thickness between the respective channel layers of the first and second thin-film transistors that constitute the E/D inverter, or by a difference in conditions of heat treatment performed on the channel layer, a difference in the threshold voltage can be created, and therefore, it is possible to make a sufficiently large difference between the respective threshold voltages of two thin-film transistors that constitute the E/D inverter (see Patent Document 1, for example).

RELATED ART DOCUMENT

Patent Document

Patent Document 1: Japanese Patent Application Laid-Open Publication No. 2009-4733

SUMMARY OF THE INVENTION

Problems to be Solved by the Invention

The E/D inverter disclosed in Patent Document 1 described above, however, has the following problem: the first and second thin-film transistors in which the respective channel layers have mutually different thicknesses are formed by depositing an amorphous IGZO film that becomes channel layers on a substrate, and thereafter etching the amorphous IGZO film (dry etching or wet etching), and therefore, when the size of the substrate is increased, it becomes difficult to control the thickness of the respective channel layers. Consequently, the evenness of the thickness thereof is reduced.

More specifically, the E/D inverter disclosed in Patent Document 1 described above has the following problem: the amorphous IGZO film is deposited with a thickness of 60 nm on an area that corresponds to the respective channel layers of the first and second thin-film transistors, and thereafter, the amorphous IGZO film that becomes the channel layer of the second thin-film transistor is etched by dry etching such that the thickness thereof becomes half of the thickness at the time when the film was formed (i.e., 30 nm). However, when the size of the substrate increases, it is not possible to evenly etch the film across the entire substrate to make the film thickness half of the thickness when the film was formed without highly advanced technology and expensive devices. Therefore, it becomes difficult to manufacture the thin-film transistors, and as a result, the yield is lowered.

The E/D inverter disclosed in Patent Document 1 described above also has the following problem: after the amorphous IGZO film that becomes the channel layer is deposited on the substrate, the channel layer is heated through contact heating or radiation of electromagnetic waves (high-frequency radiation or UV light radiation), for example, to change respective threshold voltages of the first and second thin-film transistors, but performing heat treatment selectively to such localized regions makes the heating step complex, and it is difficult to perform such a treatment to high-resolution and miniaturized thin-film transistors. As a result, the yield is lowered.

The present invention was made in view of the above problems, and aims at providing a thin-film transistor substrate, a method of manufacturing same, and a display device that make it possible to form a plurality of thin-film transistors that have mutually different threshold voltages in a simple configuration, and to prevent the yield thereof from lowering.

Means for Solving the Problems

In order to achieve the above objective, a thin-film transistor substrate of the present invention is provided with: an insulating substrate; a first thin-film transistor disposed on the insulating substrate, the first thin-film transistor being provided with a first semiconductor layer having a first channel region; a second thin-film transistor disposed on the insulating substrate, the second thin-film transistor being provided with a second semiconductor layer having a second channel region; a first insulating film that covers the first semiconductor layer and the second semiconductor layer; and a second insulating film formed of a material different from that of the first insulting film, the second insulating film being disposed on the second channel region in the second semiconductor layer so as to be sandwiched between the second semiconductor layer and the first insulating film.

According to this configuration, it becomes possible to make a difference between an insulating film structure of the channel region in the first semiconductor layer of the first thin-film transistor and an insulating film structure of the channel region in the second semiconductor layer of the second thin-film transistor. Therefore, it becomes possible to make a difference in threshold voltages between the first thin-film transistor and the second thin-film transistor, allowing a sufficiently large difference to be made between the respective threshold voltages of the two thin-film transistors. As a result, it becomes possible to fabricate a thin-film transistor substrate provided with thin-film transistors constituted of the first thin-film transistor and the second thin-film transistor having mutually different threshold voltages (i.e., an E/D inverter) with a simple configuration, hence without lowering the yield.

In the thin-film transistor substrate of the present invention, the second insulating film may be a channel protective film that protects the second channel region.

According to this configuration, in a process of forming a source electrode and a drain electrode on the second semiconductor layer, for example, when the source electrode and the drain electrode are patterned by etching, it becomes possible to protect the channel region of the second semiconductor layer from being etched.

In the thin-film transistor substrate of the present invention, the first insulating film may be an oxide silicon film made of TEOS (Tetra Ethyl Ortho Silicate), and the second insulating film may be an oxide silicon film made of $N_2O$ and $SiH_4$.

The thin-film transistor substrate of the present invention may be further provided with a source electrode and a drain electrode disposed on the second insulating film so as to face each other through the second channel region.

The thin-film transistor substrate of the present invention may be further provided with the source electrode and the drain electrode disposed between the second semiconductor layer and the second insulating film so as to face each other through the second channel region.

The thin-film transistor substrate of the present invention is provided with: an insulating substrate; a first thin-film transistor disposed on the insulating substrate, the first thin-film transistor being provided with the first semiconductor layer having the first channel region; a second thin-film transistor disposed on the insulating substrate, the second thin-film transistor being provided with the second semiconductor layer having the second channel region; and an insulating film that covers the first semiconductor layer and the second semiconductor layer, wherein a thickness of the insulating film on the first channel region in the first semiconductor layer differs from a thickness of the insulating film on the second channel region in the second semiconductor layer.

According to this configuration, it becomes possible to make a difference between the thickness of the insulating film on the channel region in the first semiconductor layer of the first thin-film transistor and the thickness of the insulating film on the channel region in the second semiconductor layer of the second thin-film transistor. Therefore, it becomes possible to make a difference in threshold voltages between the first thin-film transistor and the second thin-film transistor, allowing a sufficiently large difference to be made between the respective threshold voltages of the two thin-film transistors. As a result, it becomes possible to fabricate the thin-film transistor substrate provided with a thin-film transistors constituted of the first thin-film transistor and the second thin-film transistor having mutually different threshold voltages with a simple configuration (i.e., an E/D inverter), hence without lowering the yield.

In the thin-film transistor substrate of the present invention, the semiconductor layer may be an oxide semiconductor layer.

According to this configuration, it is possible to form a thin-film transistor that can be processed in a lower temperature and that has a higher electron mobility as compared with a thin-film transistor using amorphous silicon for a semiconductor layer.

In the thin-film transistor substrate of the present invention, the oxide semiconductor layer may be formed of metal oxide containing at least one metal selected from a group of indium (In), gallium (Ga), aluminum (Al), copper (Cu), and zinc (Zn).

According to this configuration, because the oxide semiconductor layer formed of these materials has high mobility even if the oxide semiconductor layer is an amorphous semiconductor layer, it is possible to increase an ON resistance of a switching element.

In the thin-film transistor substrate of the present invention, the oxide semiconductor layer may be made of In—Ga—Zn—O metal oxide.

According to this configuration, the thin-film transistor can be provided with desired characteristics, which are high mobility and a low OFF current.

In the thin-film transistor substrate of the present invention, the semiconductor layer may be a silicon semiconductor layer.

The thin-film transistor substrate of the present invention has an excellent characteristic that the thin-film transistor substrate provided with thin-film transistors constituted of the first thin-film transistor and the second thin-film transistor having the mutually different threshold voltages (i.e., an E/D inverter) can be fabricated with a simple configuration, hence without lowering the yield. Therefore, the thin-film transistor substrate of the present invention can be suitably applied to a display device that is provided with: the thin-film transistor substrate; an opposite substrate disposed so as to face the thin-film transistor substrate; and a display medium layer disposed between the thin-film transistor substrate and the opposite substrate. The display device of the present invention can be suitably applied to the display device in which the display medium layer is a liquid crystal layer.

A method of manufacturing a thin-film transistor substrate of the present invention is a method of manufacturing a thin-film transistor substrate that is provided with: an insulating substrate; a first thin-film transistor disposed on the insulating substrate, the first thin-film transistor being provided with a first semiconductor layer having a first channel region; a second thin-film transistor disposed on the insulating substrate, the second thin-film transistor being provided with a second semiconductor layer having a second channel region; and a first insulating film that covers the first semiconductor layer and the second semiconductor layer, the method at least including: a semiconductor layer forming step of forming the first semiconductor layer and the second semiconductor layer on the insulating substrate; a second insulating film forming step of forming a second insulating film made of a material different from that of the first insulating film on the second channel region in the second semiconductor layer; and a first insulating film forming step of forming the first insulating film so as to cover the first semiconductor layer, the second semiconductor layer, and the second insulating film.

According to this configuration, it becomes possible to manufacture a thin-film transistor substrate in which an insulating film structure of the channel region in the first semiconductor layer of the first thin-film transistor differs from an insulating film structure of the channel region in the second semiconductor layer of the second thin-film transistor. Therefore, it becomes possible to make a difference in threshold voltages between the first thin-film transistor and the second thin-film transistor, allowing a sufficiently large difference to be made between the respective threshold voltages of the two thin-film transistors. As a result, it becomes possible to fabricate a thin-film transistor substrate provided with thin-film transistors constituted of the first thin-film transistor and the second thin-film transistor having the mutually different threshold voltages (i.e., an E/D inverter) with a simple configuration, hence without lowering the yield.

In the method of manufacturing a thin-film transistor substrate of the present invention, the thin-film transistor substrate includes: an insulating substrate; a first thin-film transistor disposed on the insulating substrate, the first thin-film transistor being provided with the first semiconductor layer having the first channel region; the second thin-film transistor disposed on the insulating substrate, the second thin-film transistor being provided with the second semiconductor layer having the second channel region; and an insulating film that covers the first semiconductor layer and the second semiconductor layer, the method at least including: a semiconductor layer forming step of forming the first semiconductor layer and the second semiconductor layer on the insulating substrate; and an insulating film forming step of forming the insulating film on the first channel region and the second channel region such that a thickness thereof on the first channel region differs from a thickness thereof on the second channel region.

According to this configuration, it becomes possible to make a difference between the thickness of the insulating film on the channel region in the first semiconductor layer of the first thin-film transistor and the thickness of the insulating film on the channel region in the second semiconductor layer of the second thin-film transistor. Therefore, it becomes possible to make a difference in threshold voltages between the first thin-film transistor and the second thin-film transistor, allowing a sufficiently large difference to be made between the respective threshold voltages of the two thin-film transistors. As a result, it becomes possible to fabricate the thin-film transistor substrate provided with thin-film transistors constituted of the first thin-film transistor and the second thin-film transistor having the mutually different threshold voltages (i.e., an E/D inverter) with a simple configuration, hence without lowering the yield.

Effects of the Invention

According to the present invention, it is possible to form a plurality of thin-film transistors that have mutually different threshold voltages with a simple configuration, thereby preventing the yield of the thin-film transistor substrate from lowering.

DETAILED DESCRIPTION OF EMBODIMENTS (Embodiment 1)

Embodiments of the present invention will be described below in detail with reference to figures. The present invention is not limited to the embodiments described below.

Figure 1:
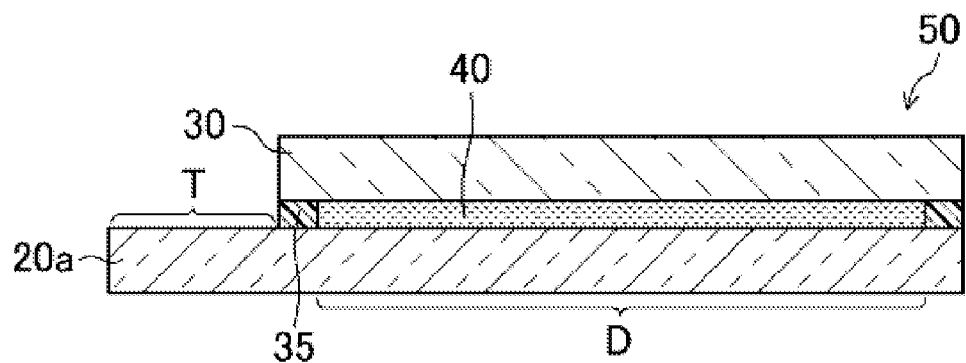
FIG. 1 is a cross-sectional view of a liquid crystal display device that has an active matrix substrate (thin-film transistor substrate) provided with thin-film transistors according to Embodiment 1 of the present invention.
Figure 2:
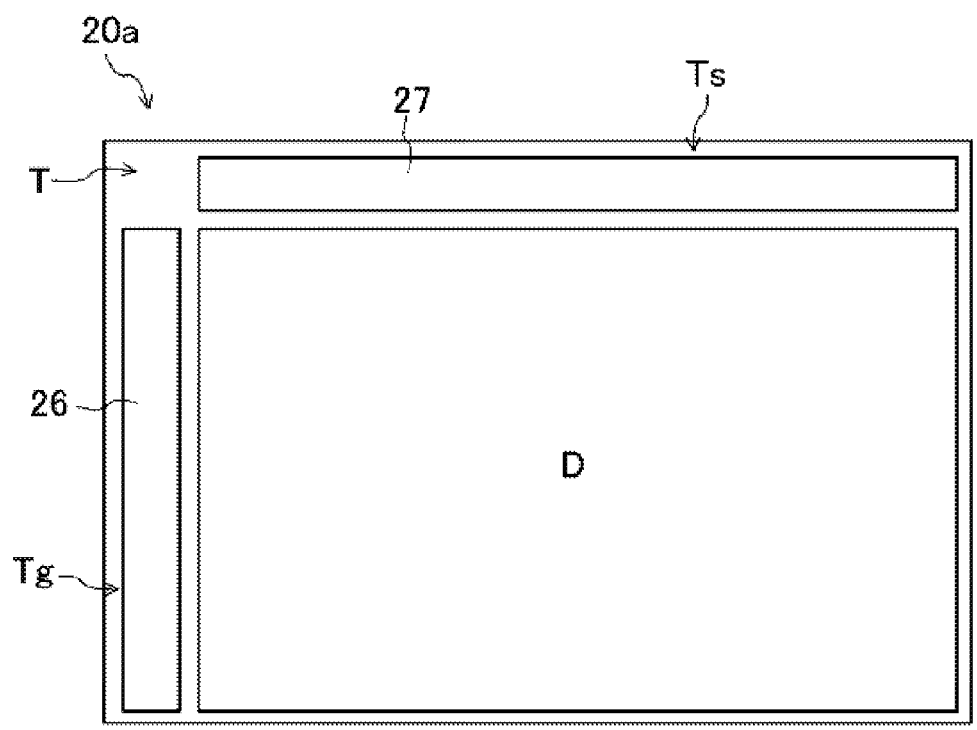
FIG. 2 is a plan view of the active matrix substrate provided with the thin-film transistors according to Embodiment 1 of the present invention.
Figure 3:
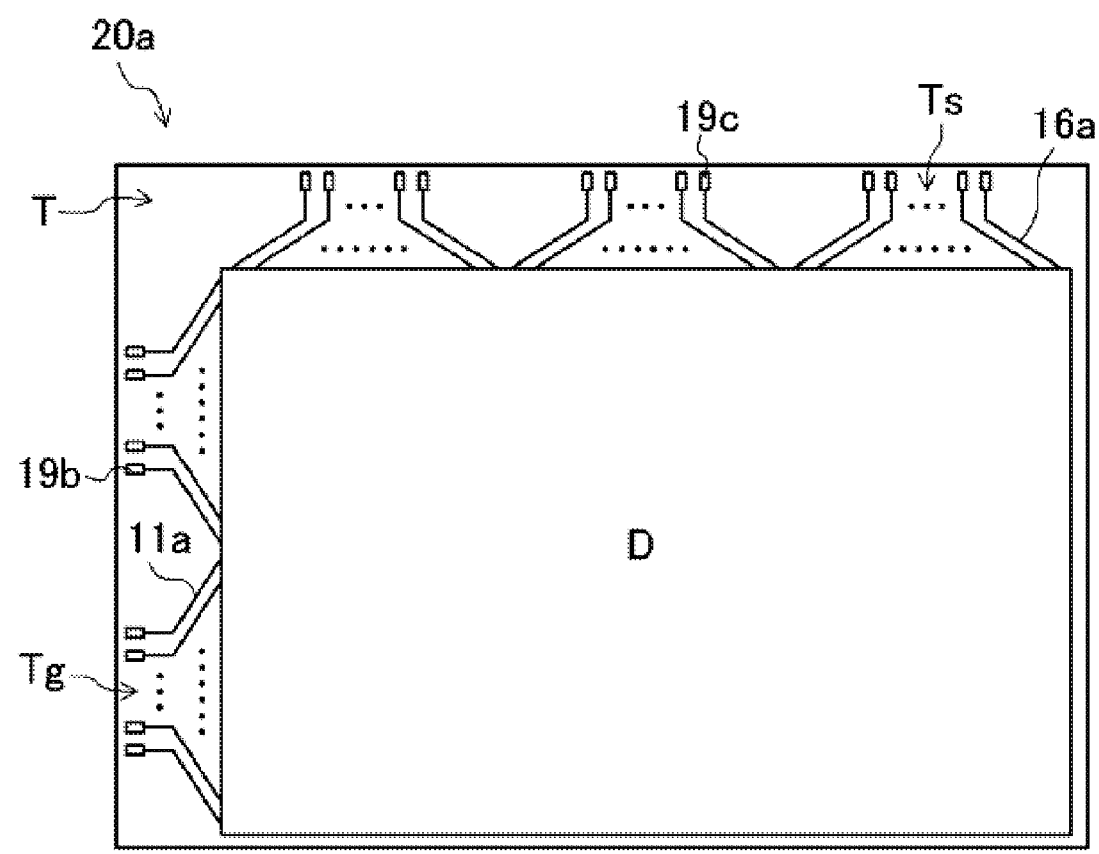
FIG. 3 is a plan view of the active matrix substrate provided with the thin-film transistors according to Embodiment 1 of the present invention.
Figure 4:
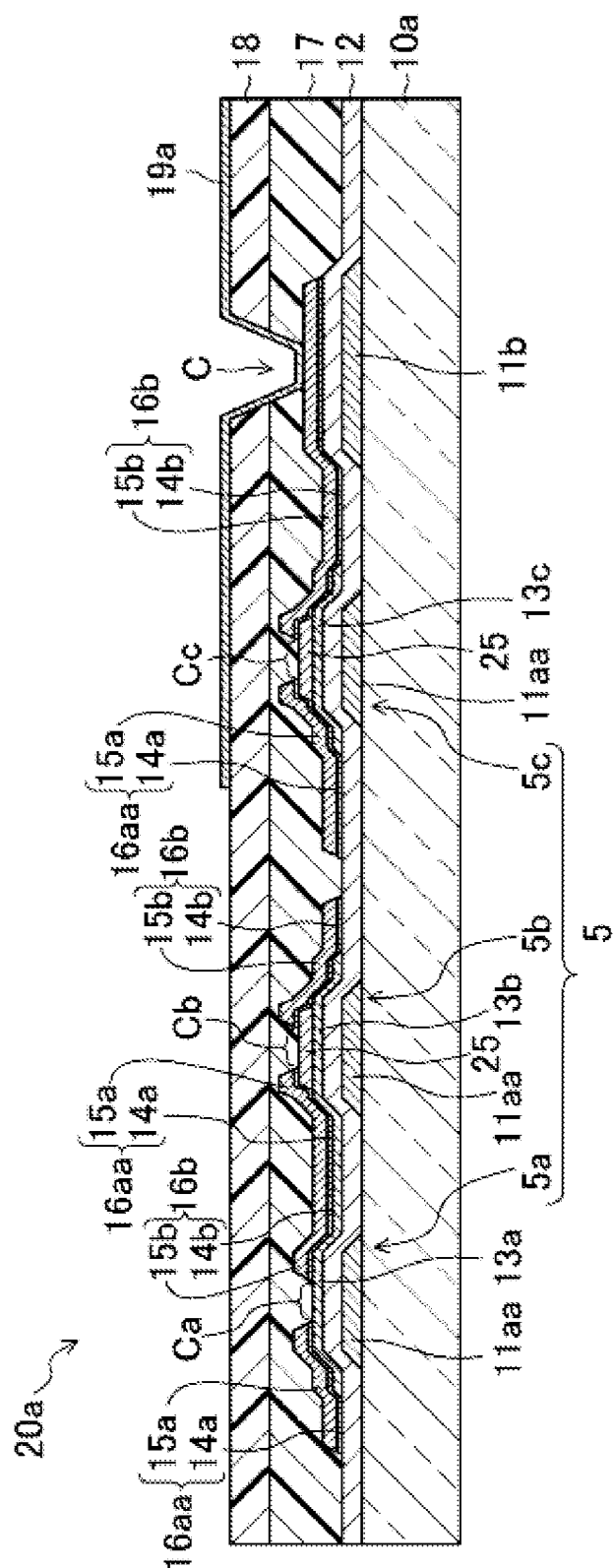
FIG. 4 is a cross-sectional view of the active matrix substrate according to Embodiment 1 of the present invention.

FIG. 1 is a cross-sectional view of a liquid crystal display device that has an active matrix substrate (thin-film transistor substrate) provided with thin-film transistors according to Embodiment 1 of the present invention. FIG. 2 is a plan view of the active matrix substrate provided with the thin-film transistors according to Embodiment 1 of the present invention. FIG. 3 is a plan view of the active matrix substrate provided with the thin-film transistors according to Embodiment 1 of the present invention. FIG. 4 is a cross-sectional view of the active matrix substrate according to Embodiment 1 of the present invention.

As shown in FIG. 1, a liquid crystal display device 50 is provided with an active matrix substrate 20a that is a thin-film transistor substrate, an opposite substrate 30 that is disposed so as to face the active matrix substrate 20a, and a liquid crystal layer 40 that is a display medium layer disposed between the active matrix substrate 20a and the opposite substrate 30. The liquid crystal display device 50 is provided with a sealing member 35 that bond the active matrix substrate 20a and the opposite substrate 30 to each other and that is disposed in a frame shape between the active matrix substrate 20a and the opposite substrate 30 so as to seal the liquid crystal layer 40 therebetween.

As shown in FIGS. 1 to 3, in the liquid crystal display device 50, a display region D that is constituted of a plurality of pixels and the like and that performs image display is defined in an inside of the sealing member 35. A driver circuit region (terminal region) T is defined in an area of the active matrix substrate 20a that protrudes from the opposite substrate 30. As shown in FIGS. 2 and 3, the driver circuit region T is provided in the periphery of the display region D.

In the driver circuit region T, a gate driver region Tg and a source driver region Ts are provided. In the gate driver region Tg, a gate driver 26 that drives scan wiring lines (gate wiring lines) 11a of the display region D is provided. In the source driver region Ts, a source driver 27 that drives signal wiring lines (source wiring lines) 16a of the display region D is provided.

As shown in FIGS. 3 and 4, the active matrix substrate 20a is provided with an insulating substrate 10a, and in the display region D thereof, the plurality of scan wiring lines 11a are disposed on the insulating substrate 10a so as to extend in parallel with each other, a plurality of auxiliary capacitance wiring lines 11b are disposed between the respective scan wiring lines 11a, and the plurality of signal wiring lines 16a are disposed on the insulating substrate 10a so as to extend in parallel with each other.

The active matrix substrate 20a is also provided with thin-film transistors 5. As shown in FIG. 4, thin-film transistors 5 include a first thin-film transistor 5a and a second thin-film transistor 5b that constitute active elements of a driver circuit (i.e., the gate driver 26) and that are formed on the insulating substrate 10a, and a third thin-film transistor 5c that is a switching element of a pixel and that is formed on the insulating substrate 10a.

As shown in FIG. 4, the active matrix substrate 20a is provided with an interlayer insulating film 17, which is a first insulating film, disposed so as to cover the first thin-film transistor 5a, the second thin-film transistor 5b, and the third thin-film transistor 5c, a planarizing film 18 disposed so as to cover the interlayer insulating film 17, a plurality of pixel electrodes 19a disposed on the planarizing film 18 in a matrix, each of which is connected to the third thin-film transistor 5c, and an alignment film (not shown) disposed so as to cover the respective pixel electrodes 19a.

As shown in FIG. 3, the scan wiring lines 11a are led out to the gate driver region Tg in the driver circuit region T, and are connected to gate terminals 19b in the gate driver region Tg.

As shown in FIG. 3, the signal wiring lines 16a are led out as relay wiring lines to the source driver region Ts in the driver circuit region T, and are connected to source terminals 19c in the source driver region Ts.

The first thin-film transistor 5a has a bottom-gate structure, and as shown in FIG. 4, the first thin-film transistor 5a is provided with a gate electrode 11aa disposed on the insulating substrate 10a and a gate insulating layer 12 disposed so as to cover the gate electrode 11aa. The first thin-film transistor 5a is provided with a first oxide semiconductor layer 13a, a source electrode 16aa, and a drain electrode 16b. The first oxide semiconductor layer 13a is formed in an island shape on the gate insulating layer 12 so as to overlap the gate electrode 11aa, and has a first channel region Ca. The source electrode 16aa and the drain electrode 16b are disposed on the first oxide semiconductor layer 13a so as to overlap the gate electrode 11aa and so as to face each other through the first channel region Ca.

In the same manner, the second thin-film transistor 5b has a bottom-gate structure, and as shown in FIG. 4, the second thin-film transistor 5b is provided with the gate electrode 11aa disposed on the insulating substrate 10a and the gate insulating layer 12 disposed so as to cover the gate electrode 11aa. The second thin-film transistor 5b is provided with a second oxide semiconductor layer 13b, the source electrode 16aa, and the drain electrode 16b. The second oxide semiconductor layer 13b is formed in an island shape on the gate insulating layer 12 so as to overlap the gate electrode 11aa, and has a second channel region Cb. The source electrode 16aa and the drain electrode 16b are disposed on the second oxide semiconductor layer 13b so as to overlap the gate electrode 11aa and so as to face each other through the second channel region Cb.

The third thin-film transistor 5c has a bottom-gate structure, and as shown in FIG. 4, the third thin-film transistor 5c is provided with the gate electrode 11aa disposed on the insulating substrate 10a and the gate insulating layer 12 disposed so as to cover the gate electrode 11aa. The third thin-film transistor 5c is provided with a third oxide semiconductor layer 13c, the source electrode 16aa, and the drain electrode 16b. The third oxide semiconductor layer 13c is formed in an island shape on the gate insulating layer 12 so as to overlap the gate electrode 11aa, and has a third channel region Cc. The source electrode 16aa and the drain electrode 16b are disposed on the third oxide semiconductor layer 13c so as to overlap the gate electrode 11aa and so as to face each other through the third channel region Cc.

The first to third oxide semiconductor layers 13a, 13b, and 13c are formed of an IGZO (In—Ga—Zn—O) oxide semiconductor film, for example.

The gate electrode 11aa is a portion of the scan wiring line 11a that protrudes to the side. The source electrode 16aa is a portion of the signal wiring line 16a that protrudes to the side. As shown in FIG. 4, the source electrode 16aa is constituted of a multilayer film of a first conductive layer 14a and a second conductive layer 15a.

Further, as shown in FIG. 4, the drain electrode 16b is constituted of a multilayer film of a first conductive layer 14b and a second conductive layer 15b.

The drain electrode 16b of the third thin-film transistor 5c is connected to the pixel electrode 19a via a contact hole C formed in a multilayer film of the interlayer insulating film 17 and the planarizing film 18. The drain electrode 16b of the third thin-film transistor 5c constitutes an auxiliary capacitance by overlapping the auxiliary capacitance wiring line 11b through the gate insulating layer 12.

As shown in FIG. 12(c), which will be described later, the opposite substrate 30 is provided with an insulating substrate 10b, a black matrix 21 disposed on the insulating substrate 10b in a grid pattern, and a color filter layer having colored layers 22 such as red layers, green layers, and blue layers respectively disposed in the respective grids of the black matrix 21. The opposite substrate 30 is also provided with a common electrode 23 disposed so as to cover the color filter layer, a photospacer 24 disposed on the common electrode 23, and an alignment film (not shown) disposed so as to cover the common electrode 23.

The liquid crystal layer 40 is constituted of a nematic liquid crystal material having electrooptic characteristics, and the like, for example.

In each pixel of the liquid crystal display device 50 having the above configuration, when a gate signal is sent from the gate driver 26 to the gate electrode 11aa through the scan wiring line 11a, and the third thin-film transistor 5c is thereby turned ON, a source signal is sent from the source driver 27 to the source electrode 16aa through the signal wiring line 16a, and prescribed electric charges are written in the pixel electrode 19a through the oxide semiconductor layer 13c and the drain electrode 16b.

This creates an electrical potential difference between the respective pixel electrodes 19a on the active matrix substrate 20a and the common electrode 23 on the opposite substrate 30, and prescribed voltages are thereby applied to the liquid crystal layer 40, i.e., to a liquid crystal capacitance of the respective pixels, and to an auxiliary capacitance that is connected to the liquid crystal capacitance in parallel.

In each pixel, the orientation state of the liquid crystal layer 40 is changed depending on the size of the voltages applied to the liquid crystal layer 40, and light transmittance of the liquid crystal layer 40 is thereby adjusted, making it possible to display an image in the liquid crystal display device 50.

In the present embodiment, as shown in FIG. 4, a channel protective film 25, which is a second insulating film for protecting the channel region Cb, is disposed on the second channel region Cb in the second oxide semiconductor layer 13b of the second thin-film transistor 5b that functions as an active element of a driver circuit (i.e., the gate driver 26).

More specifically, as shown in FIG. 4, in the first and second thin-film transistors 5a and 5b that constitute the active elements of the driver circuit, the interlayer insulating film 17 is disposed on the first channel region Ca in the first oxide semiconductor layer 13a of the first thin-film transistor 5a, and the channel protective film 25 described above is not disposed thereon. The channel protective film 25 is disposed only on the second channel region Cb in the second oxide semiconductor layer 13b of the second thin-film transistor 5b.

According to this configuration, it becomes possible to make a difference between an insulating film structure of the first channel region Ca in the first oxide semiconductor layer 13a of the first thin-film transistor 5a and an insulating film structure of the second channel region Cb in the second oxide semiconductor layer 13b of the second thin-film transistor 5b. Therefore, it becomes possible to make a difference between respective threshold voltages of the first thin-film transistor 5a and of the second thin-film transistor 5b, and the difference between the respective threshold voltages of the two thin-film transistors 5a and 5b can be made sufficiently large. As a result, it becomes possible to fabricate thin-film transistors constituted of the first thin-film transistor 5a and the second thin-film transistor 5b having mutually different threshold voltages (i.e., an E/D inverter) with a simple configuration.

As shown in FIG. 4, in the present embodiment, the channel protective film 25, which is the second insulating film for protecting the channel region Cc, is disposed also on the third channel region Cc in the third oxide semiconductor layer 13c of the third thin-film transistor 5c that functions as the switching element of the pixel, in the same manner as the second thin-film transistor 5b.

In the present embodiment, the first thin-film transistor 5a is used as a depletion thin-film transistor having a low threshold voltage, and the second thin-film transistor 5b is used as an enhancement thin-film transistor having a high threshold voltage. The first and second thin-film transistors 5a and 5b constitute an enhancement/depletion (E/D) inverter that has a large difference in threshold voltages between the respective transistors.

The third thin-film transistor 5c is used for the switching element of the pixel as an enhancement thin-film transistor that has a high threshold voltage and a low leak current.

Next, an example of a method of manufacturing the liquid crystal display device 50 of the present embodiment will be described with reference to FIGS. 5 to 12. FIGS. 5 to 11 are explanatory diagrams showing a process of manufacturing the first to third thin-film transistors and the active matrix substrate in cross-sectional views. FIG. 12 is an explanatory diagram showing a process of manufacturing the opposite substrate in cross-sectional views. The manufacturing method in the present embodiment includes steps of fabricating the thin-film transistor and the active matrix substrate, fabricating the opposite substrate, and injecting the liquid crystal.

First, the process of fabricating the thin-film transistor and the active matrix substrate will be described.

<Process of Forming Gate Electrode>

Figure 5:
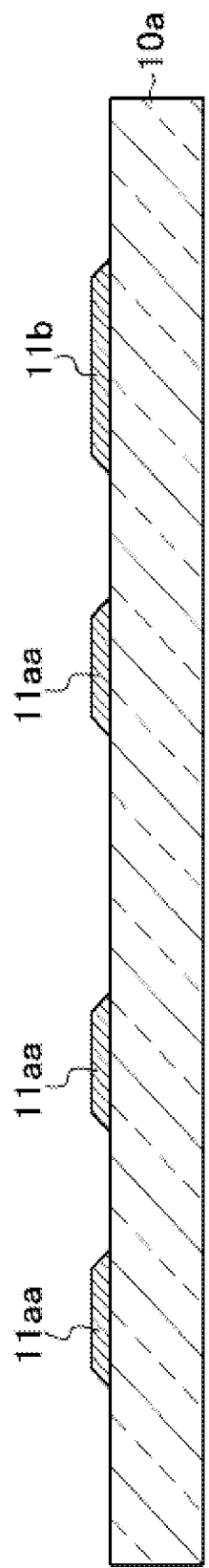
FIG. 5 is an explanatory diagram showing a step of manufacturing a first thin-film transistor, a second thin-film transistor, and an active matrix substrate according to Embodiment 1 of the present invention, in a cross-sectional view.

First, on the entire insulating substrate 10a such as a glass substrate, a silicon substrate, or a plastic substrate having a heat resistance, a molybdenum film (about 150 nm thick) or the like, for example, is deposited by sputtering. Next, the molybdenum film undergoes photolithography, wet etching, resist removal, and washing, thereby forming the gate electrode 11aa and the auxiliary capacitance wiring line 11b on the insulating substrate 10a as shown in FIG. 5. When the gate electrode 11aa and the auxiliary capacitance wiring line 11b are formed, the scan wiring line 11a and the signal wiring line 16a are formed at the same time.

In the present embodiment, the molybdenum film having a single layer structure is described as an example of a metal film that constitutes the gate electrode 11aa. Alternatively, the gate electrode 11aa as may be formed of a metal film such as an aluminum film, a tungsten film, a tantalum film, a chromium film, a titanium film, and a copper film, an alloy film of these metals, or a film constituted of metal nitride, for example, in a thickness of 50 nm to 300 nm.

For a material for forming the plastic substrate, a polyethylene terephthalate resin, a polyethylene naphthalate resin, a polyether sulfone resin, an acrylic resin, and a polyimide resin, for example, can be used.

<Process of Forming Semiconductor Layer>

Figure 6:
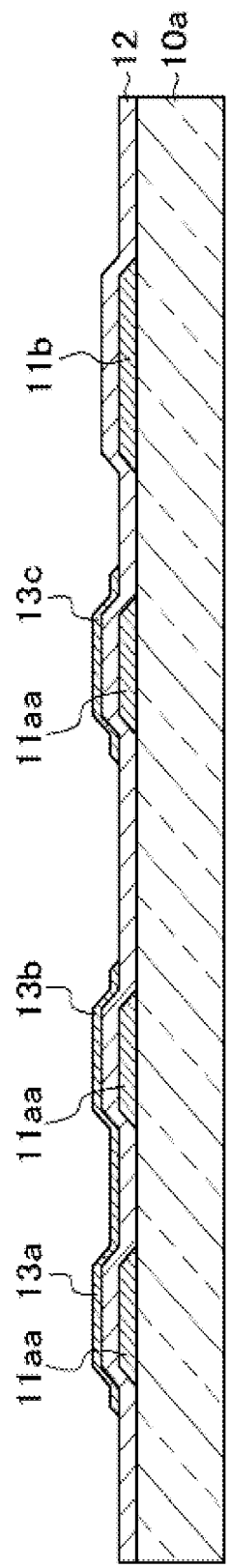
FIG. 6 is an explanatory diagram showing a step of manufacturing the first thin-film transistor, the second thin-film transistor, and the active matrix substrate according to Embodiment 1 of the present invention, in a cross-sectional view.

Next, as shown in FIG. 6, on the entire substrate having the gate electrode 11aa and the auxiliary capacitance wiring line 11b formed thereon, a silicon nitride film (about 200 nm to 500 nm thick), for example, is deposited by the CVD method, thereby forming the gate insulating layer 12 so as to cover the gate electrode 11aa and the auxiliary capacitance wiring line 11b.

The gate insulating layer 12 may have a multilayer structure constituted of two layers. In this case, in addition to the silicon nitride film ($SiN_x$) described above, a silicon oxide film ($SiO_x$), a silicon oxide nitride film ($SiO_xN_y$; x>y), a silicon nitride oxide film ($SiN_xO_y$; x>y), or the like, for example, can be used.

In view of preventing impurities and the like from being diffused from the insulating substrate 10a, it is preferable that, for a lower gate insulating film, a silicon nitride film or a silicon nitride oxide film be used, and for an upper gate insulating film, a silicon oxide film or a silicon oxide nitride film be used.

For the lower gate insulating film, a silicon nitride film can be formed with a thickness of 100 nm to 200 nm using $SiH_4$ and $NH_3$ as reaction gas, and for the upper gate insulating film, a silicon oxide film can be formed with a thickness of 50 nm to 100 nm using $N_2O$ and $SiH_4$ as reaction gas, for example.

Further, in view of forming the fine gate insulating layer 12 having a small gate leak current in a low deposition temperature, it is preferable that noble gas such as an argon gas be contained in the reaction gas, thereby mixing the noble gas into the insulating film.

Thereafter, an IGZO oxide semiconductor film (about 30 nm to 100 nm thick), for example, is deposited by sputtering. Next, the oxide semiconductor film undergoes photolithography, wet etching, resist removal, and washing, thereby forming the first to third oxide semiconductor layers 13a, 13b, and 13c as shown in FIG. 6.

<Process of Forming Channel Protective Film (Process of Forming Second Insulating Film)>

Figure 7:
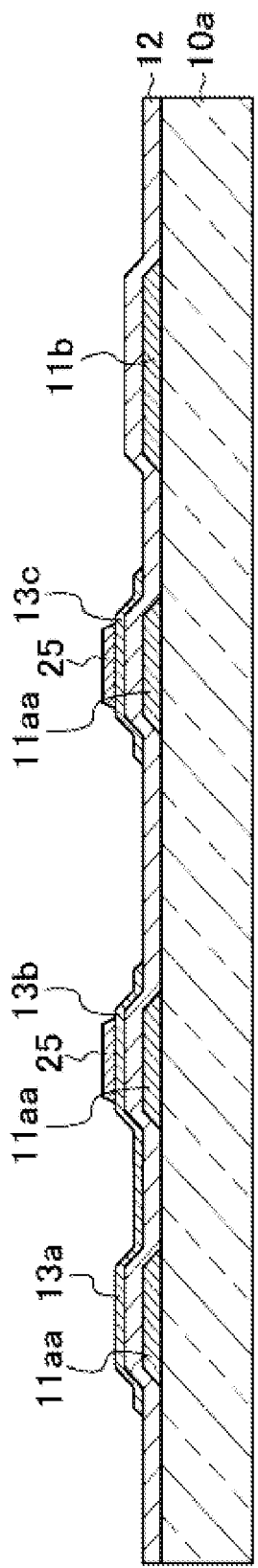
FIG. 7 is an explanatory diagram showing a step of manufacturing the first thin-film transistor, the second thin-film transistor, and the active matrix substrate according to Embodiment 1 of the present invention, in a cross-sectional view.

Next, on the entire substrate having the first to third oxide semiconductor layers 13a, 13b, and 13c formed thereon, a silicon nitride film, a silicon oxide film, a silicon nitride oxide film, or the like, for example, is deposited by the plasma CVD method. Thereafter, the formed film undergoes photolithography and etching using the resist as a mask, resist removal, and washing, thereby forming the channel protective film 25 on the second channel region Cb in the second oxide semiconductor layer 13b for protecting the channel region Cb with a thickness of about 50 to 100 nm as shown in FIG. 7. In the same manner, the channel protective film 25 is formed on the third channel region Cc in the third oxide semiconductor layer 13c for protecting the channel region Cc with a thickness of about 50 to 100 nm.

For the channel protective film 25, a silicon oxide film can be formed with a thickness of 100 nm to 200 nm using $SiH_4$ and $N_2O$ as reaction gas, for example.

<Process of Forming Source and Drain>

On the entire substrate having the first to third oxide semiconductor layers 13a, 13b, and 13c, and the channel protective film 25 formed thereon, a titanium film (30 nm to 150 nm thick), a copper film (about 50 nm to 400 nm thick), and the like, for example, are deposited in this order by sputtering. Next, the copper film is processed by photolithography and wet etching, and the titanium film is processed by dry etching, resist removal, and washing, thereby forming the signal wiring line 16a (see FIG. 3), the source electrode 16aa, and the drain electrode 16b as shown in FIG. 8.

Here, the first channel region Ca in the first oxide semiconductor layer 13a, the second channel region Cb in the second oxide semiconductor layer 13b covered by the channel protective film 25, and the third channel region Cc in the third oxide semiconductor layer 13c covered by the channel protective film 25 are exposed.

Figure 8:
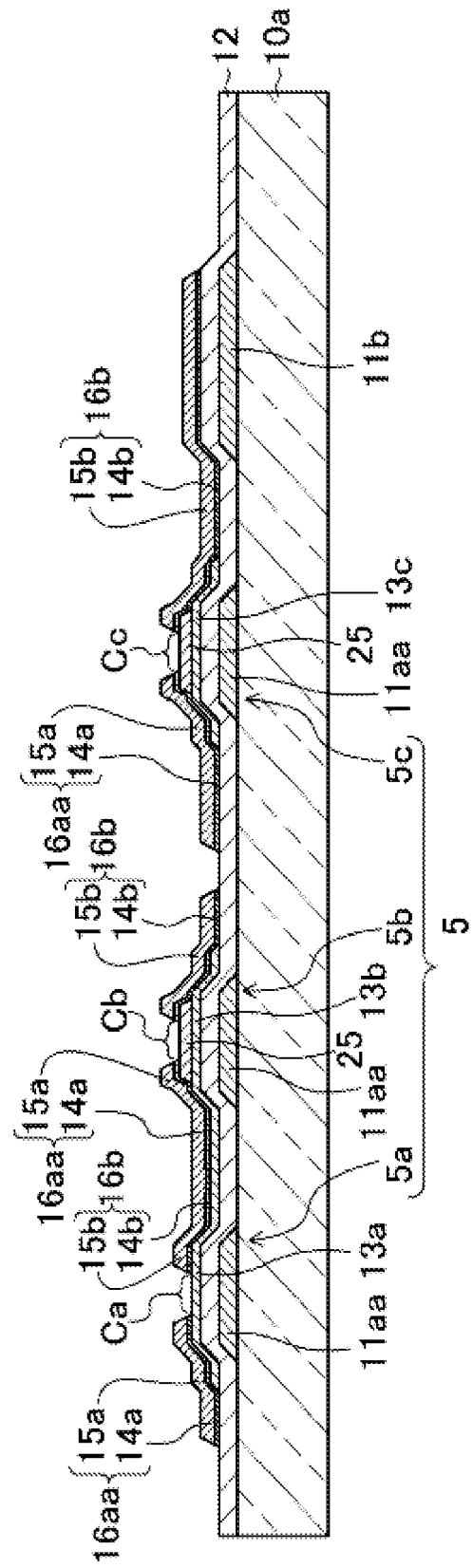
FIG. 8 is an explanatory diagram showing a step of manufacturing the first thin-film transistor, the second thin-film transistor, and the active matrix substrate according to Embodiment 1 of the present invention, in a cross-sectional view.

As shown in FIG. 8, in the second thin-film transistor 5b, the source electrode 16aa and the drain electrode 16b are disposed on the channel protective film 25 so as to face each other through the second channel region Cb.

In the same manner, as shown in FIG. 8, in the third thin-film transistor 5c, the source electrode 16aa and the drain electrode 16b are disposed on the channel protective film 25 so as to face each other through the third channel region Cc.

In the present embodiment, a multilayer structure of the titanium film and the copper film is described as an example of a metal film that constitutes the source electrode 16aa and the drain electrode 16b. Alternatively, the source electrode 16aa and the drain electrode 16b may be formed by a metal film such as an aluminum film, a tungsten film, a tantalum film, and a chromium film, an alloy film made of these metals, or a film made of metal nitride.

Alternatively, a transparent conductive material such as indium tin oxide (ITO), indium zinc oxide (IZO), indium tin oxide containing silicon oxide (ITSO), indium oxide ($In_2O_3$), tin oxide ($SnO_2$), zinc oxide (ZnO), and titanium nitride (TiN) may be used.

For etching, dry etching or wet etching may be performed as described above. In case of processing a large area substrate, dry etching is preferable. For etching gas, a fluorine gas such as $CF_4$, $NF_3$, $SF_6$, and $CHF_3$, a chlorine gas such as $Cl_2$, $BCl_3$, $SiCl_4$, and $CCl_4$, an oxygen gas, or the like can be used, and an inactive gas such as helium and argon may be added thereto.

<Process of Forming Interlayer Insulating Film (Process of Forming First Insulating Film)>

Figure 9:
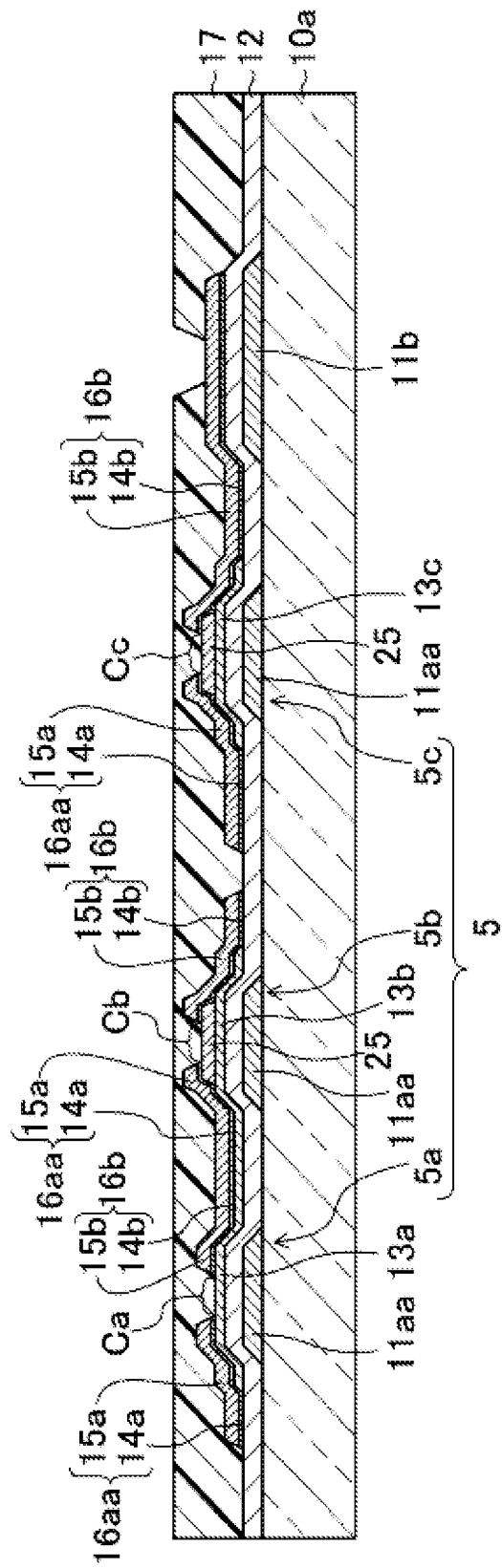
FIG. 9 is an explanatory diagram showing a step of manufacturing the first thin-film transistor, the second thin-film transistor, and the active matrix substrate according to Embodiment 1 of the present invention, in a cross-sectional view.

Next, on the entire substrate having the source electrode 16aa and the drain electrode 16b formed thereon (i.e., having the first to third thin-film transistors 5a, 5b, and 5c formed thereon), a silicon nitride film, a silicon oxide film, a silicon nitride oxide film, or the like, for example, is deposited by the plasma CVD method, thereby forming the interlayer insulating film 17 with a thickness of about 200 to 300 nm so as to cover the first to third thin-film transistors 5a, 5b, and 5c (i.e., cover the first to third oxide semiconductor layers 13a, 13b, and 13c, the source electrode 16aa, the drain electrode 16b, and the channel protective film 25), as shown in FIG. 9.

In the present embodiment, for the interlayer insulating film 17, a silicon oxide film with a thickness of 200 nm to 300 nm can be formed by the plasma CVD method, for example, using TEOS (Tetra Ethyl Ortho Silicate) as a source gas, for example.

Next, a resist mask is formed on the interlayer insulating film 17 in the photolithography step, and as shown in FIG. 9, etching is performed to form the contact hole C, and an entire surface of the substrate is processed by heat.

A mechanism of change in a threshold voltage of the thin-film transistor in a structure in which the insulating film is in contact with the oxide semiconductor layer will be described.

Generally, semiconductor characteristics of a thin-film transistor provided with an oxide semiconductor layer are significantly affected by oxygen vacancy concentration in an oxide semiconductor layer. Even after the oxide semiconductor layer is formed, the oxygen vacancy concentration in the oxide semiconductor layer is increased or decreased due to the effects of surrounding moisture or oxygen.

In case of the insulating film structure in which a protective insulating film (channel protective film) is disposed on the oxide semiconductor layer as in the present embodiment, the characteristics of the thin-film transistor are largely affected by properties of the protective insulating film.

When forming an oxide silicon film, which is used as the channel protective film 25, to be 100 nm to 200 nm thick using $SiH_4$ and $N_2O$ as reaction gas, as in the present embodiment, for example, if a proportion (flow volume) of $N_2O$ is large, oxygen concentration increases. Therefore, an oxidation effect on the second oxide semiconductor layer 13b becomes greater, and because a proportion of $SiH_4$ is small, hydrogen concentration decreases, resulting in a decrease in a reduction effect on the second oxide semiconductor layer 13b.

Figure 13:
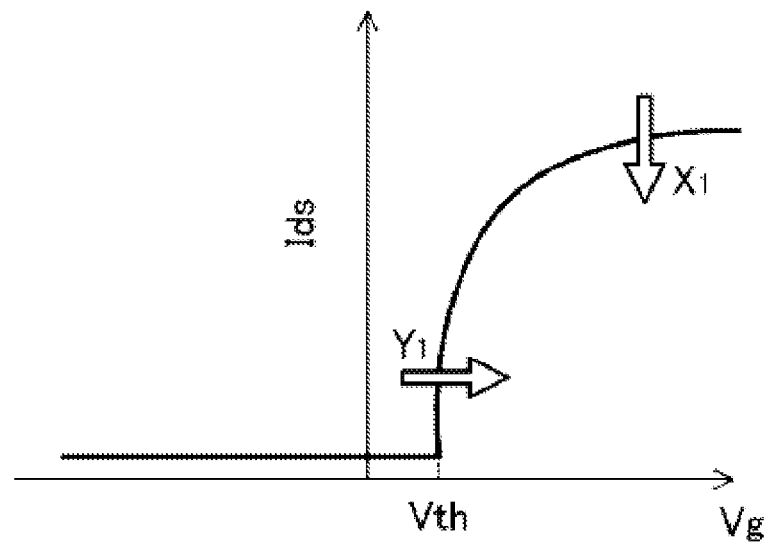
FIG. 13 is an Ids-Vg characteristic graph showing a relationship between a drain and source current (Ids) and a gate voltage (Vg).

As a result, as shown in the Ids-Vg characteristic in FIG. 13, which shows a relationship between a drain and source current (Ids) and a gate voltage (Vg), a current value decreases (i.e., a current value is shifted in a direction indicated by the arrow $X_1$ in FIG. 13), thereby lowering the leak current, and a threshold voltage Vth is increased (i.e., the threshold voltage is shifted in a direction indicated by the arrow $Y_1$ in FIG. 13).

Therefore, it becomes possible to use the second thin-film transistor 5b, which is provided with the second oxide semiconductor layer 13b having the channel protective film 25 disposed on the second channel region Cb, as an enhancement thin-film transistor that has the high threshold voltage Vth.

According to the same principle, it becomes possible to use the third thin-film transistor 5c, which is provided with the third oxide semiconductor layer 13c having the channel protective film 25 disposed on the third channel region Cc, as an enhancement thin-film transistor that has the high threshold voltage Vth and a low leak current.

If a proportion (flow volume) of $N_2O$ is small, oxygen concentration decreases. Therefore, the oxidation effect on the second oxide semiconductor layer 13b becomes smaller, and because a proportion of $SiH_4$ is large, the hydrogen concentration is increased, resulting in an increase in a reduction effect on the second oxide semiconductor layer 13b.

Figure 14:
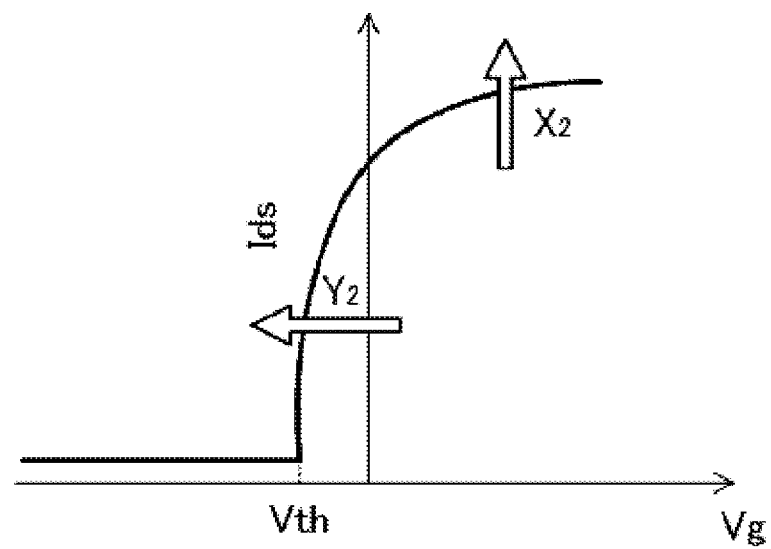
FIG. 14 is an Ids-Vg characteristic graph showing a relationship between the drain and source current (Ids) and the gate voltage (Vg).

As a result, as shown in the Ids-Vg characteristic in FIG. 14, which shows a relationship between the drain and source current (Ids) and the gate voltage (Vg), the current value increases (i.e., the current value is shifted in a direction indicated by the arrow $X_2$ in FIG. 14) and the threshold voltage Vth decreases (i.e., the threshold voltage Vth is shifted in a direction indicated by the arrow $Y_2$ in the FIG. 14).

<Process of Forming Planarizing Film>

Figure 10:
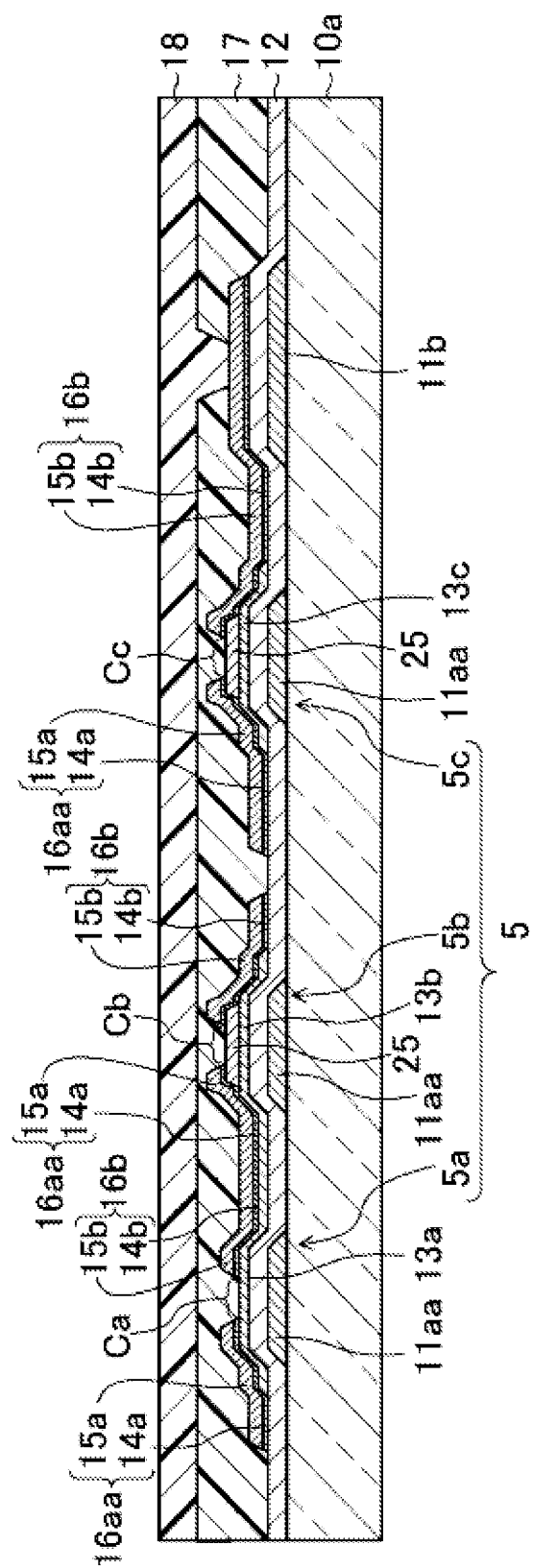
FIG. 10 is an explanatory diagram showing a step of manufacturing the first thin-film transistor, the second thin-film transistor, and the active matrix substrate according to Embodiment 1 of the present invention, in a cross-sectional view.

Next, as shown in FIG. 10, on the entire substrate having the interlayer insulating film 17 formed thereon, a photosensitive organic insulating film formed of a photosensitive acrylic resin or the like is applied with a thickness of about 1.0 μm to 3.0 μm by the spin coating method or the slit coating method, thereby forming the planarizing film 18 on a surface of the interlayer insulating film 17.

<Process of Forming Opening>

Figure 11:
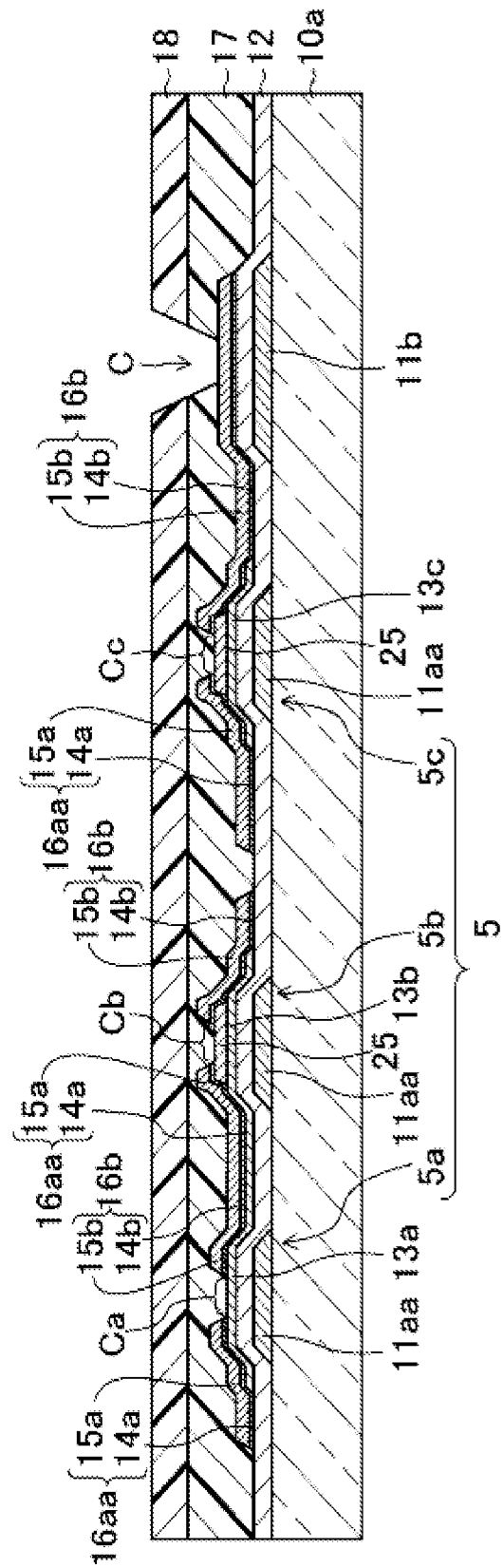
FIG. 11 is an explanatory diagram showing a step of manufacturing the first thin-film transistor, the second thin-film transistor, and the active matrix substrate according to Embodiment 1 of the present invention, in a cross-sectional view.
Figure 12:
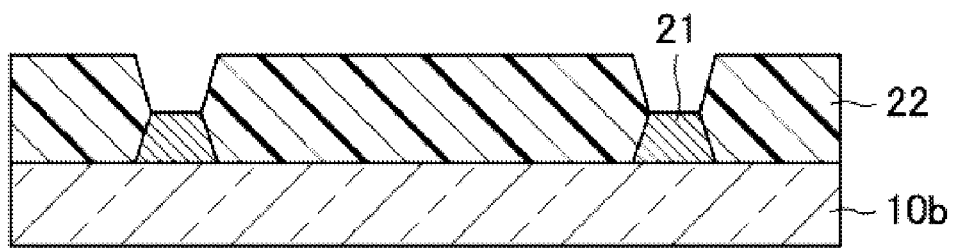
FIG. 12 is an explanatory diagram showing steps of manufacturing an opposite substrate in cross-sectional views.
Figure 12:
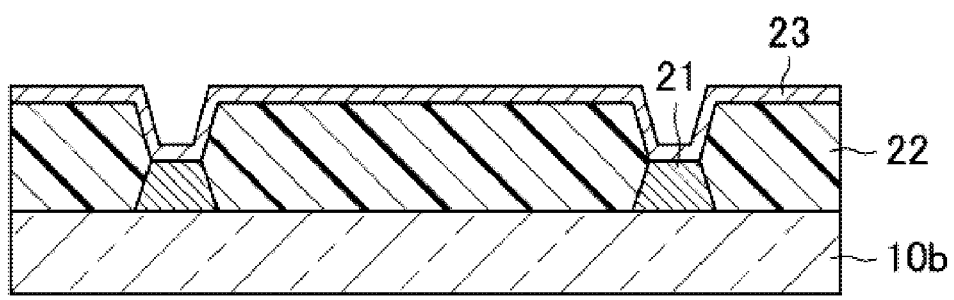
Figure 12:
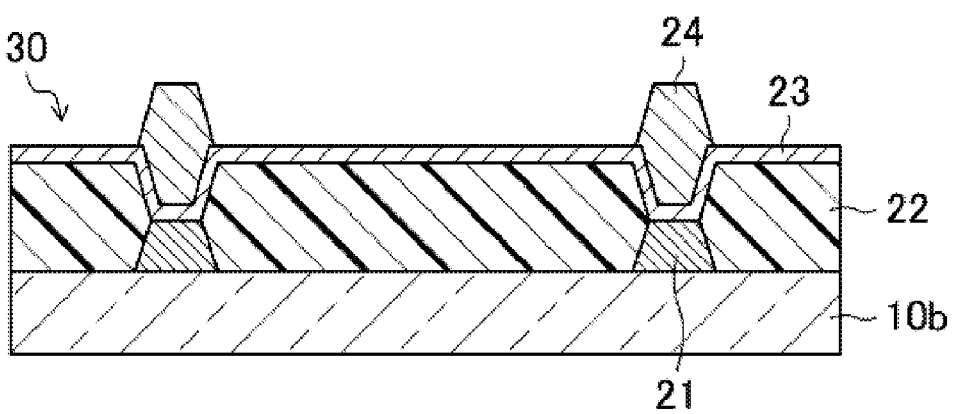

Next, the planarizing film 18 is exposed and developed, thereby forming the contact hole C in the planarizing film 18, which reaches the drain electrode 16b as shown in FIG. 11.

<Process of Forming Pixel Electrode>

Next, on the entire substrate having the interlayer insulating film 17 and the planarizing film 18 formed thereon, a transparent conductive film such as an ITO film made of indium tin oxide (about 50 nm to 200 nm thick), for example, is deposited by sputtering. Thereafter, the transparent conductive film undergoes photolithography, wet etching, resist removal, and washing, thereby forming the pixel electrode 19a, the gate terminal 19b (see FIG. 3), and the source terminal 19c (see FIG. 3) as shown in FIG. 4.

Here, as shown in FIG. 4, the pixel electrode 19a is formed on the respective surfaces of the planarizing film 18 and the interlayer insulating film 17 so as to cover the surface of the contact hole C.

When forming the transmissive liquid crystal display device 50, for the pixel electrode 19a, indium oxide or indium zinc oxide (IZO) that contains tungsten oxide, indium oxide or indium tin oxide (ITO) that contains titanium oxide, or the like can be used. Further, instead of the indium zinc oxide and the indium tin oxide described above, indium tin oxide that contains silicon oxide (ITSO) or the like can also be used.

When forming the reflective liquid crystal display device 50, for a metal thin film that has reflectivity, a conductive film made of titanium, tungsten, nickel, gold, platinum, silver, aluminum, magnesium, calcium, lithium, or an alloy made of these metals can be used, and this metal thin film can be used as the pixel electrode 19a.

The active matrix substrate 20a shown in FIG. 4 can be fabricated in the above-mentioned manner.

<Process of Fabricating Opposite Substrate>

First, on the entire insulating substrate 10b that is a glass substrate or the like, a photosensitive resin that is colored black, for example, is applied by the spin coating method or the slit coating method. Next, this photosensitive resin film is exposed and developed, thereby forming the black matrix 21 with a thickness of about 1.0 μm as shown in FIG. 12(a).

Next, on the entire substrate having the black matrix 21 formed thereon, a photosensitive resin that is colored red, green, or blue, for example, is applied by the spin coating method or the slit coating method. Thereafter, this photosensitive resin film is exposed and developed, thereby forming the colored layers 22 of a selected color (red layers, for example) with a thickness of about 2.0 μm as shown in FIG. 12(a). The same steps are repeated for the other two colors, thereby forming the respective colored layers 22 of the other two colors (green layers and blue layers, for example) with the respective thickness of about 2.0 μm.

Further, on the substrate having the colored layers 22 of the respective colors formed thereon, a transparent conductive film such as an ITO film, for example, is deposited by sputtering, thereby forming the common electrode 23 with a thickness of about 50 nm to 200 nm as shown in FIG. 12(b).

Lastly, on the entire substrate having the common electrode 23 formed thereon, a photosensitive resin is applied by the spin coating method or the slit coating method. Thereafter, this photosensitive resin film is exposed and developed, thereby forming the photospacers 24 with a thickness of about 4 μm as shown in FIG. 12(c).

The opposite substrate 30 can be fabricated in the above-mentioned manner.

<Process of Injecting Liquid Crystal>

First, on the surface of the active matrix substrate 20a that was fabricated in the process of fabricating the active matrix substrate, and on the surface of the opposite substrate 30 that was fabricated in the process of fabricating the opposite substrate, polyimide resin films are respectively applied by the printing method. Thereafter, the baking process and the rubbing process are performed on these polyimide resin films, thereby forming alignment films.

Next, on the surface of the opposite substrate 30 having the alignment film formed thereon, for example, the sealing member 35 formed of a UV- (ultraviolet-) curable and thermosetting resin or the like is printed in a frame shape. Thereafter, a liquid crystal material is dripped in an inside of the sealing member.

Further, the opposite substrate 30 having the liquid crystal material dripped thereon and the active matrix substrate 20a having the alignment film formed thereon are bonded under the reduced pressure. Thereafter, the bonded laminated body is exposed to the atmospheric pressure such that a pressure is applied to the front surface and to the rear surface of the laminated body.

Next, the sealing member 35 is cured by radiating UV light to the sealing member 35 held by the laminated body, and by heating the laminated body thereafter.

Lastly, the laminated body that holds the cured sealing member 35 is cut by dicing, for example, thereby removing the unnecessary portions.

The liquid crystal display device 50 of the present embodiment can be manufactured in the above-mentioned manner.

According to the present embodiment described above, the following effects can be achieved.

(1) In the present embodiment, the channel protective film 25, which is the second insulating film formed of a material different from that of the interlayer insulating film 17, is disposed on the second channel region Cb of the second oxide semiconductor layer 13b so as to be interposed between the second oxide semiconductor layer 13b and the interlayer insulating film 17, which is the first insulating film. Therefore, it becomes possible to make a difference between an insulating film structure of the first channel region Ca in the first oxide semiconductor layer 13a of the first thin-film transistor 5a and an insulating film structure of the second channel region Cb in the second oxide semiconductor layer 13b of the second thin-film transistor 5b. This makes it possible to make a difference in the respective threshold voltages between the first thin-film transistor 5a and the second thin-film transistor 5b, thereby making a sufficiently large difference between the respective threshold voltages of the two thin-film transistors 5a and 5b. As a result, it becomes possible to fabricate the active matrix substrate 20a provided with thin-film transistors constituted of the first thin-film transistor 5a and the second thin-film transistor 5b having the mutually different threshold voltages (i.e., an E/D inverter) with a simple configuration.

(2) It also becomes possible to achieve a high-quality device that is capable of high-current drive and low-voltage drive. Therefore, it becomes possible to achieve a sophisticated circuit such as a pixel memory circuit, an optical sensor circuit, and an OLED driver circuit, for example.

(3) In the present embodiment, the channel protective film 25 for protecting the channel region Cb is disposed on the second channel region Cb in the second oxide semiconductor layer 13b. Therefore, in the process of forming the source electrode 16aa and the drain electrode 16b, when the source electrode 16aa and the drain electrode 16b are patterned by etching, it becomes possible to protect the second channel region Cb in the second oxide semiconductor layer 13b from being etched.

(4) In the present embodiment, the first and second oxide semiconductor layers 13a and 13b are used as the semiconductor layer. Therefore, it is possible to form a thin-film transistor that can be processed in a lower temperature and that has higher electron mobility as compared with a thin-film transistor using amorphous silicon for a semiconductor layer.

(Embodiment 2)

Figure 15:
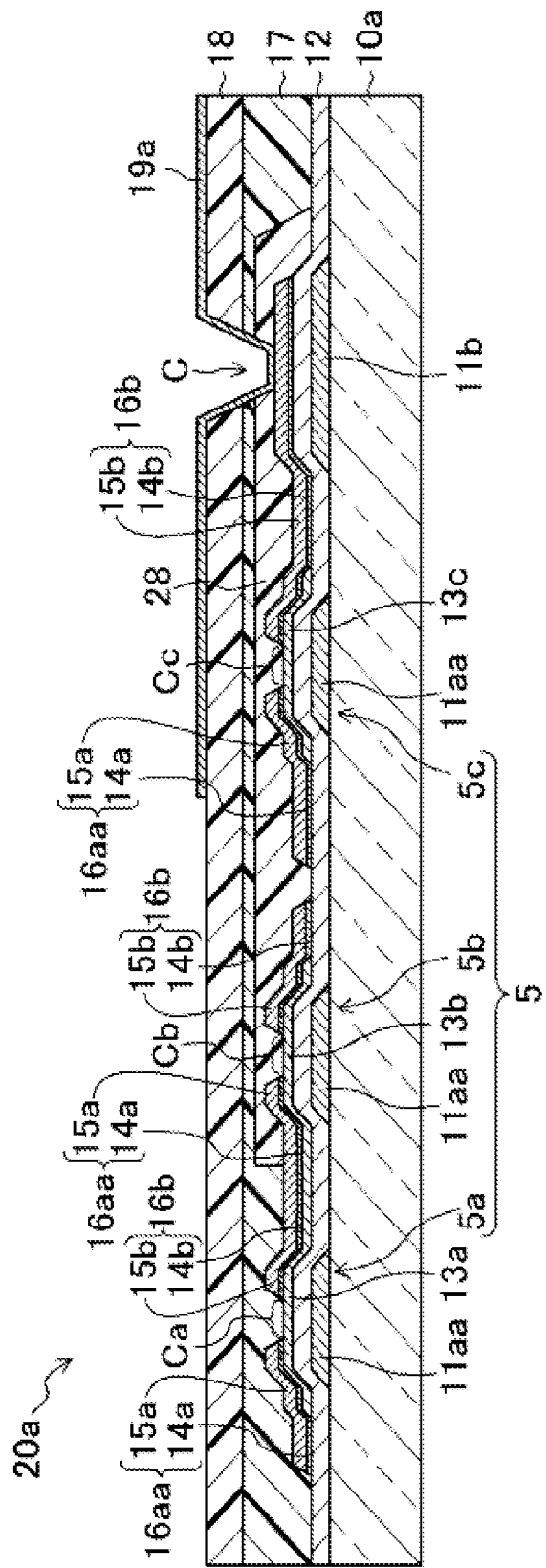
FIG. 15 is a cross-sectional view of an active matrix substrate provided with thin-film transistors according to Embodiment 2 of the present invention.

Next, Embodiment 2 of the present invention will be described. FIG. 15 is a cross-sectional view of an active matrix substrate provided with a thin-film transistor according to Embodiment 2 of the present invention. In the present embodiment, the same components as those in Embodiment 1 will be given the same reference characters, and descriptions thereof will not be repeated. Because an overall structure of the liquid crystal display device and a method of manufacturing thereof are the same as those in Embodiment 1, detailed descriptions thereof will not be repeated.

In the present embodiment, for the second insulating film, another interlayer insulating film (hereinafter referred to as "interlayer insulating film") 28 is provided as shown in FIG. 15, instead of the channel protective film 25 described above.

More specifically, as shown in FIG. 15, in the first thin-film transistor 5a and the second thin-film transistor 5b that function as an active element of a driver circuit, the first channel region Ca in the first oxide semiconductor layer 13a has the interlayer insulating film 17 formed thereon, but does not have the interlayer insulating film 28 described above, and the second channel region Cb in the second oxide semiconductor layer 13b has the interlayer insulating film 28 formed thereon.

In this configuration, in the same manner as Embodiment 1, it becomes possible to make an insulating film structure of the first channel region Ca in the first oxide semiconductor layer 13a of the first thin-film transistor 5a differ from an insulating film structure of the second channel region Cb in the second oxide semiconductor layer 13b of the second thin-film transistor 5b.

Therefore, it becomes possible to make a difference in threshold voltages between the first thin-film transistor 5a and the second thin-film transistor 5b, allowing a sufficiently large difference to be made between the respective threshold voltages of the two thin-film transistors 5a and 5b. As a result, it becomes possible to fabricate an active matrix substrate provided with thin-film transistors constituted of the first thin-film transistor 5a and the second thin-film transistor 5b having the mutually different threshold voltages (i.e., an E/D inverter) with a simple configuration.

In the present embodiment, as shown in FIG. 15, the interlayer insulating film 28, which is the second insulting film for protecting the channel region Cc, is also disposed on the third channel region Cc in the third oxide semiconductor layer 13c of the third thin-film transistor 5c that functions as a switching element of a pixel, in the same manner as the second thin-film transistor 5b.

Figure 16:
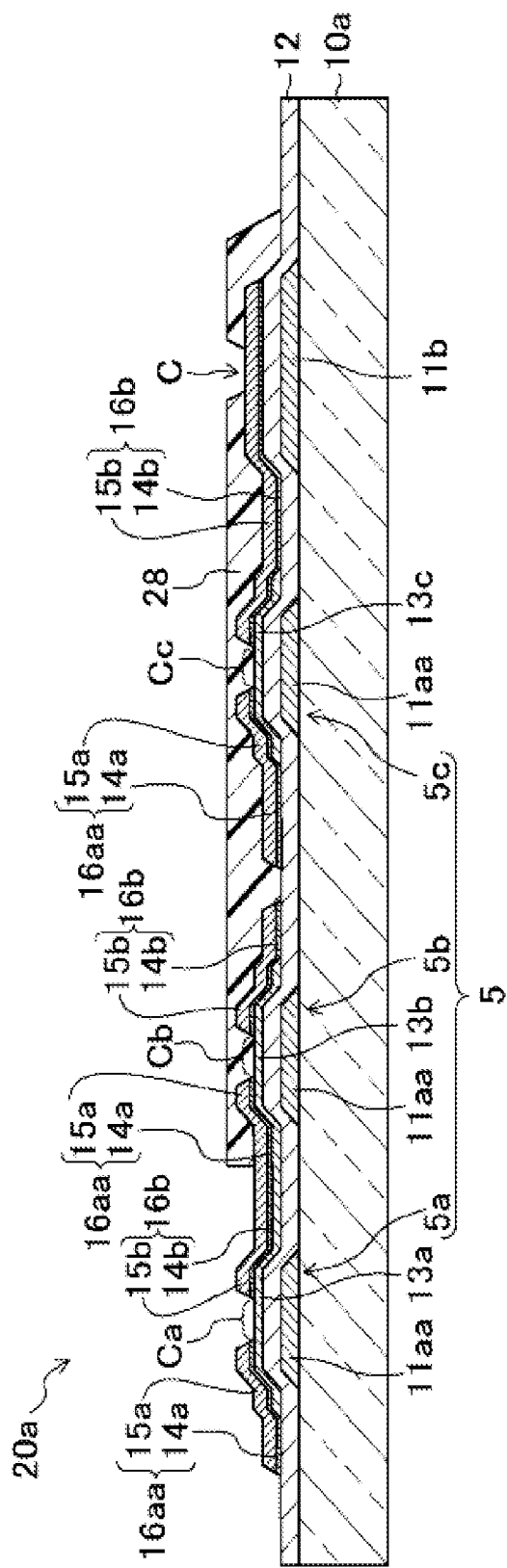
FIG. 16 is an explanatory diagram showing a step of manufacturing a second thin-film transistor and the active matrix substrate according to Embodiment 2 of the present invention, in a cross-sectional view.

Next, an example of a method of manufacturing a liquid crystal display device of the present embodiment will be described with reference to FIG. 16. FIG. 16 is an explanatory diagram showing a process of manufacturing a thin-film transistor and an active matrix substrate in a cross-sectional view.

First, in the process of fabricating the thin-film transistor and the active matrix substrate, the process of forming a gate electrode and process of forming a semiconductor layer are performed as described in Embodiment 1 with reference to FIGS. 5 and 6.

<Process of Forming Source and Drain>

Next, on the entire substrate having the first to third oxide semiconductor layers 13a, 13b, and 13c formed thereon, a titanium film (30 nm to 150 nm thick), a copper film (about 50 nm to 400 nm thick), and the like, for example, are deposited in this order by sputtering. Thereafter, the copper film undergoes photolithography and wet etching, and the titanium film undergoes dry etching, resist removal, and washing, thereby forming the signal wiring line 16a (see FIG. 3), the source electrode 16aa, and the drain electrode 16b as shown in FIG. 16. Here, the first channel region Ca in the first oxide semiconductor layer 13a, the second channel region Cb in the second oxide semiconductor layer 13b, and the third channel region Cc in the third oxide semiconductor layer 13c are exposed.

As shown in FIG. 16, in the second thin-film transistor 5b, the source electrode 16aa and the drain electrode 16b are disposed on the second oxide semiconductor layer 13b so as to face each other through the second channel region Cb.

In the same manner, as shown in FIG. 16, in the third thin-film transistor 5c, the source electrode 16aa and the drain electrode 16b are disposed on the third oxide semiconductor layer 13c so as to face each other through the third channel region Cc.

<Process of Forming Interlayer Insulating Film (Process of Forming Second Insulating Film)>

Next, on the surface of the substrate where the second and third thin-film transistors 5b and 5c are formed, a silicon nitride film, a silicon oxide film, a silicon nitride oxide film, or the like, for example, is deposited by the plasma CVD method, and as shown in FIG. 16, by selectively patterning the film through etching, the interlayer insulating film 28 that covers the second and third thin-film transistors 5b and 5c (i.e., the interlayer insulating film 28 covers the second and third oxide semiconductor layers 13b and 13c, the source electrode 16aa, and the drain electrode 16b) is formed with a thickness of about 200 to 300 nm.

Here, in the present embodiment, as shown in FIG. 16, the source electrode 16aa and the drain electrode 16b are disposed between the second oxide semiconductor layer 13b and the interlayer insulating film 28 so as to face each other through the second channel region Cb.

<Process of Forming Interlayer Insulating Film (Process of Forming First Insulating Film)>

Next, in the same manner as described above with reference to FIG. 9, on the entire substrate having the first to third thin-film transistors 5a, 5b, and 5c formed thereon, a silicon nitride film, a silicon oxide film, a silicon nitride oxide film, or the like, for example, is deposited by the plasma CVD method with a thickness of about 200 to 300 nm, thereby forming the interlayer insulating film 17 that covers the first to third thin-film transistors 5a, 5b, and 5c (i.e., the interlayer insulating film 17 covers the first to third oxide semiconductor layers 13a, 13b, and 13c, the source electrode 16aa, the drain electrode 16b, and the interlayer insulating film 28).

Next, in the same manner as described above with reference to FIG. 9, a resist mask is formed on the interlayer insulating film 17 in the photolithography step, etching is thereafter performed to form the contact hole C, and the entire surface of the substrate is processed by heat.

In the present embodiment, for another interlayer insulating film 28, an silicon oxide film with a thickness of 200 nm to 300 nm can be formed using $N_2O$ and $SiH_4$, for example.

Next, in the same manner as described above in Embodiment 1 with reference to FIGS. 10 and 11, the process of forming the planarizing film, the process of forming the opening, and the process of forming the pixel electrode are performed, and the active matrix substrate 20a shown in FIG. 15 can be fabricated.

Further, the process of fabricating the opposite substrate and the process of injecting the liquid crystal described above in Embodiment 1 are performed, and the liquid crystal display device 50 of the present embodiment can be manufactured.

According to the present embodiment described above, the same effects as (1) to (4) described above can be achieved.

The above-mentioned embodiment may be modified as follows.

In the above-mentioned embodiments, the oxide semiconductor layer was used as the semiconductor layer, but the semiconductor layer is not limited to such. Instead of the oxide semiconductor layer, a silicon semiconductor layer made of amorphous silicon or polysilicon, for example, may be used for the semiconductor layer of the thin-film transistor.

In the above-mentioned embodiments, the oxide semiconductor layer made of the In—Ga—Zn—O metal oxide was used as the oxide semiconductor layer, but the oxide semiconductor layer is not limited to such. Alternatively, the oxide semiconductor layer may use a material made of metal oxide that contains at least one metal out of indium (In), gallium (Ga), aluminum (Al), copper (Cu), zinc (Zn), magnesium (Mg), and cadmium (Cd).

Because the oxide semiconductor layer 13a made of these materials has high mobility even if the oxide semiconductor layer 13a is an amorphous semiconductor layer, it is possible to increase an ON resistance of a switching element. Therefore, a difference in output voltages upon data reading is made larger, and an S/N ratio is thereby improved.

Instead of IGZO (In—Ga—Zn—O), an oxide semiconductor film made of $InGaO_3$ $(ZnO)_5$, $Mg_xZn_{1-x}O$, $Cd_xZn_{1-x}O$, CdO, or the like, for example, can be used.

It is also possible to use ZnO in an amorphous state, in a polycrystalline state, or in a microcrystalline state in which the amorphous state and the polycrystalline state are mixed, to which one kind or multiple kinds of impurity elements out of the group 1 elements, the group 13 elements, the group 14 elements, the group 15 elements, or the group 17 elements are added, or ZnO to which none of the above impurity elements are added can also be used.

Figure 17:
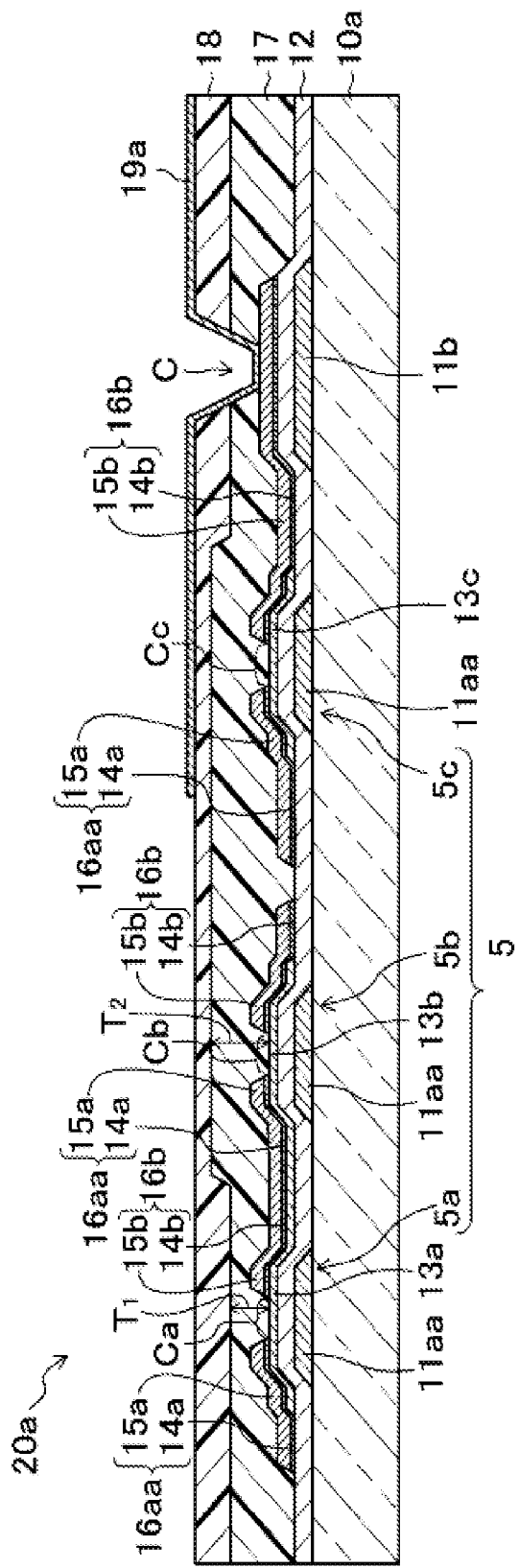
FIG. 17 is a cross-sectional view showing a modification example of an active matrix substrate provided with thin-film transistors according to an embodiment of the present invention.

It may be configured such that the channel protective film 25 and the interlayer insulating film 28 described above are not provided, but instead, a difference in thickness is made in the interlayer insulating film 17. More specifically, as shown in FIG. 17, it may be configured such that a thickness $T_1$ of the interlayer insulating film 17 on the first channel region Ca in the first oxide semiconductor layer 13a of the first thin-film transistor 5a differs from a thickness $T_2$ of the interlayer insulating film 17 on the second channel region Cb in the second oxide semiconductor layer 13b of the second thin-film transistor 5b (in FIG. 17, $T_2 > T_1$).

In this case, in the liquid crystal display device 50 having a bottom-gate thin-film transistor, moisture or ions (positive ions) in the liquid crystal layer 40 that is an electrooptic material are attracted to an electrical potential of the gate electrode 11aa, or the like, and the moisture or the ions are accumulated as positive electric charges at the interface of the planarizing film 18 and the liquid crystal layer 40 on the planarizing film 18. The moisture or the ions are diffused downwardly in the planarizing film 18, thereby generating electric charges (positive electric charges) at the interface of the interlayer insulating film 17 and the planarizing film 18.

Consequently, a back channel is formed in the channel region of the thin-film transistor because of the electric charges, thereby causing a shift in the threshold voltage of the thin-film transistor. However, as described above, the thickness $T_1$ of the interlayer insulating film 17 on the first channel region Ca in the first oxide semiconductor layer 13a differs from the thickness $T_2$ of the interlayer insulating film 17 on the second channel region Cb in the second oxide semiconductor layer 13b. Thus, the electric charges generated at the interface of the interlayer insulating film 17 and the planarizing film 18 become different between the first channel region Ca and the second channel region Cb.

Therefore, a shift amount of the threshold voltage of the first thin-film transistor 5a differs from a shift amount of the threshold voltage of the second thin-film transistor 5b. This makes it possible to make a difference between the respective threshold voltages of the first thin-film transistor 5a and of the second thin-film transistor 5b in the same manner as the above case where the channel protective film 25 and the interlayer insulating film 28 are provided. As a result, it becomes possible to make a sufficiently large difference between the respective threshold voltages of the two thin-film transistors 5a and 5b.

Therefore, it becomes possible to fabricate the active matrix substrate 20*a* provided with thin-film transistors constituted of the first thin-film transistor 5*a* and the second thin-film transistor 5*b* having the mutually different threshold voltages (i.e., an E/D inverter), with a simple configuration.

It also becomes possible to achieve a high-quality device that is capable of high-current drive and low-voltage drive. Therefore, it becomes possible to achieve a sophisticated circuit such as a pixel memory circuit, an optical sensor circuit, and an OLED driver circuit, for example.

In this case, in the process of fabricating the thin-film transistor and the active matrix substrate, first, the process of forming the gate electrode, the process of forming the semiconductor layer, and the process of forming the source and the drain are performed in the same manner as Embodiment 2.

Next, on the surface of the substrate having the first to third thin-film transistors 5*a*, 5*b*, and 5*c* formed thereon, a silicon nitride film, a silicon oxide film, a silicon nitride oxide film, or the like, for example, is deposited by the plasma CVD method. Thereafter, this deposited film is selectively patterned by etching, thereby forming the interlayer insulating film 17 that covers the first to third thin-film transistors 5*a*, 5*b*, and 5*c* (i.e., the interlayer insulating film 17 covers the first to third oxide semiconductor layers 13*a*, 13*b*, and 13*c*, the source electrode 16*aa*, and the drain electrode 16*b*) as shown in FIG. 17.

Here, as shown in FIG. 17, the interlayer insulating film 17 on the first channel region Ca and the second channel region Cb is formed such that the thickness $T_1$ in the first channel region Ca differs from the thickness $T_2$ in the second channel region Cb.

In this case, as shown in FIG. 17, the thickness of the interlayer insulating film 17 formed on the third channel region Cc in the third oxide semiconductor layer 13*c*, which is provided in the third thin-film transistor 5*c* that functions as a switching element of a pixel, is set to the same thickness as that of the interlayer insulating film 17 on the second channel region Cb in the second oxide semiconductor layer 13*b* (i.e., $T_2$).

Next, in the same manner as described above with reference to FIG. 9, a resist mask is formed on the interlayer insulating film 17 by the photolithography step, etching is thereafter performed to form the contact hole C, and the entire surface of the substrate is processed by heat.

Next, in the same manner as described above in Embodiment 1 with reference to FIGS. 10 and 11, the process of forming the planarizing film, the process of forming the opening, and the process of forming the pixel electrode are performed, thereby fabricating the active matrix substrate 20*a* as shown in FIG. 17.

Further, the process of fabricating the opposite substrate and the process of injecting the liquid crystal described in Embodiment 1 are performed, and consequently, the liquid crystal display device 50 of the present embodiment can be manufactured.

Industrial Applicability

The present invention can be used for a thin-film transistor substrate that uses a semiconductor layer made of an oxide semiconductor, a method of manufacturing the same, and a display device.

Description of Reference Characters

5 thin-film transistor
  5*a* first thin-film transistor
  5*b* second thin-film transistor
  5*c* third thin-film transistor
  10*a* insulating substrate
  11*aa* gate electrode
  12 gate insulating layer
  13*a* first oxide semiconductor layer (first semiconductor layer)
  13*b* second oxide semiconductor layer (second semiconductor layer)
  13*c* third oxide semiconductor layer
  16*aa* source electrode
  16*b* drain electrode
  17 interlayer insulating film (first insulating film)
  18 planarizing film
  19*a* pixel electrode
  20*a* active matrix substrate (thin-film transistor substrate)
  25 channel protective film (second insulating film)
  28 another interlayer insulating film (second insulating film)
  30 opposite substrate
  40 liquid crystal layer (display medium layer)
  50 liquid crystal display device
  Ca first channel region
  Cb second channel region
  Cc third channel region
  $T_1$ thickness of interlayer insulating film in first channel region
  $T_2$ thickness of interlayer insulating film in second channel region

The invention claimed is:

1. A thin-film transistor substrate, comprising:
an insulating substrate;
a first thin-film transistor disposed on the insulating substrate, the first thin-film transistor being provided with a first semiconductor layer having a first channel region;
a second thin-film transistor disposed on the insulating substrate, the second thin-film transistor being provided with a second semiconductor layer having a second channel region;
a first insulating film that covers the first semiconductor layer and the second semiconductor layer; and
a second insulating film formed of a material different from that of the first insulting film, the second insulating film being disposed on the second channel region in the second semiconductor layer so as to be sandwiched between the second semiconductor layer and the first insulating film.

2. The thin-film transistor substrate according to claim 1, wherein the second insulating film is a channel protective film that protects the second channel region.

3. The thin-film transistor substrate according to claim 2, wherein the first insulating film is an oxide silicon film made of TEOS (Tetra Ethyl Ortho Silicate), and the second insulating film is an oxide silicon film made of $N_2O$ and $SiH_4$.

4. The thin-film transistor substrate according to claim 1, further comprising a source electrode and a drain electrode disposed on the second insulating film so as to face each other through the second channel region.

5. The thin-film transistor substrate according to claim 1, further comprising a source electrode and a drain electrode disposed between the second semiconductor layer and the second insulating film so as to face each other through the second channel region.

6. A thin-film transistor substrate, comprising:
an insulating substrate;
a first thin-film transistor disposed on the insulating substrate, the first thin-film transistor being provided with a first semiconductor layer having a first channel region;

a second thin-film transistor disposed on the insulating substrate, the second thin-film transistor being provided with a second semiconductor layer having a second channel region; and an insulating film that covers the first semiconductor layer and the second semiconductor layer, wherein a thickness of the insulating film on the first channel region in the first semiconductor layer differs from a thickness of the insulating film on the second channel region in the second semiconductor layer.

7. The thin-film transistor substrate according to claim 1, wherein the first semiconductor layer and the second semiconductor layer are oxide semiconductor layers.

8. The thin-film transistor substrate according to claim 7, wherein the oxide semiconductor layer is formed of metal oxide containing at least one metal selected from a group of indium (In), gallium (Ga), aluminum (Al), copper (Cu), and zinc (Zn).

9. The thin-film transistor substrate according to claim 8, wherein the oxide semiconductor layer is made of In—Ga—Zn—O metal oxide.

10. The thin-film transistor substrate according to claim 1, wherein the semiconductor layer is a silicon semiconductor layer.

11. A display device, comprising:
the thin-film transistor substrate according to claim 1;
an opposite substrate disposed so as to face the thin-film transistor substrate; and
a display medium layer disposed between the thin-film transistor substrate and the opposite substrate.

12. The display device according to claim 11, wherein the display medium layer is a liquid crystal layer.

13. A method of manufacturing a thin-film transistor substrate that includes: an insulating substrate; a first thin-film transistor disposed on the insulating substrate, the first thin-film transistor being provided with a first semiconductor layer having a first channel region; a second thin-film transistor disposed on the insulating substrate, the second thin-film transistor being provided with a second semiconductor layer having a second channel region; and a first insulating film that covers the first semiconductor layer and the second semiconductor layer, the method comprising:

a semiconductor layer forming step of forming the first semiconductor layer and the second semiconductor layer on the insulating substrate;

a second insulating film forming step of forming a second insulating film made of a material different from that of the first insulating film on the second channel region; and a first insulating film forming step of forming the first insulating film so as to cover the first semiconductor layer, the second semiconductor layer, and the second insulating film.

14. A method of manufacturing a thin-film transistor substrate that includes: an insulating substrate; a first thin-film transistor disposed on the insulating substrate, the first thin-film transistor being provided with a first semiconductor layer having a first channel region; a second thin-film transistor disposed on the insulating substrate, the second thin-film transistor being provided with a second semiconductor layer having a second channel region; and an insulating film that covers the first semiconductor layer and the second semiconductor layer, the method comprising:

a semiconductor layer forming step of forming the first semiconductor layer and the second semiconductor layer on the insulating substrate; and an insulating film forming step of forming the insulating film on the first channel region and the second channel region such that a thickness thereof on the first channel region differs from a thickness thereof on the second channel region.

15. The thin-film transistor substrate according to claim 6, wherein the first semiconductor layer and the second semiconductor layer are oxide semiconductor layers.

16. The thin-film transistor substrate according to claim 15, wherein the oxide semiconductor layer is formed of metal oxide containing at least one metal selected from a group of indium (In), gallium (Ga), aluminum (Al), copper (Cu), and zinc (Zn).

17. The thin-film transistor substrate according to claim 16, wherein the oxide semiconductor layer is made of In-Ga-Zn-O metal oxide.

18. The thin-film transistor substrate according to claim 6, wherein the semiconductor layer is a silicon semiconductor layer.

19. A display device, comprising:
the thin-film transistor substrate according to claim 6;
an opposite substrate disposed so as to face the thin-film transistor substrate; and
a display medium layer disposed between the thin-film transistor substrate and the opposite substrate.

20. The display device according to claim 19, wherein the display medium layer is a liquid crystal layer.

* * * * *